United States Patent [19]
Matsui et al.

[11] Patent Number: 4,939,737
[45] Date of Patent: Jul. 3, 1990

[54] SCANNING APPARATUS WITH REFRACTING AREA OF VARIABLE REREFRACTIVE INDEX

[75] Inventors: Sadayoshi Matsui, Tenri; mototaka Taneya, Tsukuba; Mitsuhiro Matsumoto, Nara, all of Japan

[73] Assignee: Sharp Kabushiki Kaisha, Japan

[21] Appl. No.: 156,263

[22] Filed: Feb. 16, 1988

[30] Foreign Application Priority Data

Feb. 16, 1987 [JP] Japan .................................. 62-33004

[51] Int. Cl.$^5$ ............................................... H01S 3/10
[52] U.S. Cl. ........................................ 372/24; 372/50
[58] Field of Search ................... 372/24, 50, 46, 92, 372/99, 18, 97

[56] References Cited

U.S. PATENT DOCUMENTS

| | | | |
|---|---|---|---|
| 3,344,365 | 9/1967 | Lewis | 372/24 |
| 3,402,366 | 9/1968 | Williams | 331/94.5 |
| 3,436,679 | 1/1969 | Fenner | 331/94.5 |
| 3,517,337 | 6/1970 | Shah | 332/7.51 |
| 4,002,997 | 1/1977 | Thompson | 372/50 |
| 4,462,658 | 7/1984 | Scifres | 350/96.14 |
| 4,503,541 | 3/1985 | Weller et al. | 372/92 |
| 4,564,946 | 1/1986 | Olsson | 372/20 |
| 4,608,697 | 8/1986 | Coldren | 372/92 |
| 4,675,873 | 6/1987 | Miller | 372/92 |
| 4,677,630 | 6/1987 | Fujita et al. | 372/92 |
| 4,743,087 | 5/1988 | Utaka et al. | 350/96.13 |
| 4,768,201 | 8/1988 | Taneya et al. | 372/97 |
| 4,803,692 | 2/1989 | Sakano et al. | 372/50 |
| 4,815,084 | 3/1989 | Scifres et al. | 372/50 |
| 4,815,090 | 3/1989 | Usami et al. | 372/96 |

FOREIGN PATENT DOCUMENTS

| | | |
|---|---|---|
| 2711293 | 10/1977 | Fed. Rep. of Germany . |
| 0130488 | 8/1982 | Japan ..................................... 372/50 |
| 0111383 | 12/1982 | Japan ..................................... 372/32 |
| 2053555 | 4/1981 | United Kingdom . |
| 2176939 | 7/1987 | United Kingdom . |

*Primary Examiner*—Frank Gonzalez

[57] ABSTRACT

A scanning apparatus with a refracting function comprising a laser beam oscillating area, one or more refracting areas with a waveguide having different refractive indexes, wherein an electric field is applied to the waveguide of the refracting area, by which the changes in the refractive index of the waveguide of the refracting area are attained so that laser beams from the laser beam oscillating area undergo refraction while they pass through the waveguide of the refracting area.

3 Claims, 6 Drawing Sheets

SCANNING APPARATUS WITH REFRACTING AREA OF VARIABLE REREFRACTIVE INDEX

BACKGROUND OF THE INVENTION

1. Field of the Invention

This invention relates to a scanning apparatus, and more particularly it relates to an optoelectric type scanning apparatus with a refracting function that comprises a semiconductor laser device.

2. Description of the Prior Art

As a scanning apparatus in which a laser beam oscillating area (i.e., a heterostructure laser device) and a refracting area is incorporated into one body on the same substrate, a monolithic type scanning apparatus has been proposed by Japanese Laid-Open Patent Application No. 57-79921, in which the phase of a broad laser beam is regulated on the waveguide so as to refract the laser beam, thereby attaining a high scanning-resolution.

In the above-mentioned conventional scanning apparatus, since a broad laser beam is used, a number of independent electrodes are required to regulate the phase of the laser beam and the regulation of the phase must be carried out with an accuracy which is extremely difficult and complicated to obtain.

SUMMARY OF THE INVENTION

The scanning apparatus with a refracting function of this invention, which overcomes the above-discussed and numerous other disadvantages and deficiencies of the prior art, comprises a laser beam oscillating areas, one or more refracting area with a waveguide having different refractive indexes, and a means for applying an electric field to the waveguide of said refracting area, by which the changes in the refractive index of the waveguide of said refracting area are attained so that laser beams from said laser beam oscillating area undergo refraction while they pass through the waveguide of said refracting area.

In a preferred embodiment, the difference in the refractive index of the waveguide of said refracting area is attained by the injection of protons into said waveguide. Alternatively, the difference in the refractive index of the waveguide of said refracting area is attained by the diffusion of a dopant into the waveguide.

Thus, the invention described herein makes possible the objective of providing a scanning apparatus with a refracting function in which a laser beam oscillating area and a refracting area are formed on the same substrate and the refractive index of the waveguide of the refracting area is changed by the application of an electric field thereto, so that laser beams oscillated from the laser beam oscillating area can be readily refracted while they pass through the waveguide of the refracting area.

DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a scanning apparatus in which laser beams are incident upon the waveguide of the refracting area at a certain angle and accordingly when the refractive index of the said waveguide is varied by the application of an electric field thereto, the angle of refraction of the laser beams on the waveguide can be easily varied, thereby attaining the refraction of laser beams in a wide range.

EXAMPLE 1

Figure 1:
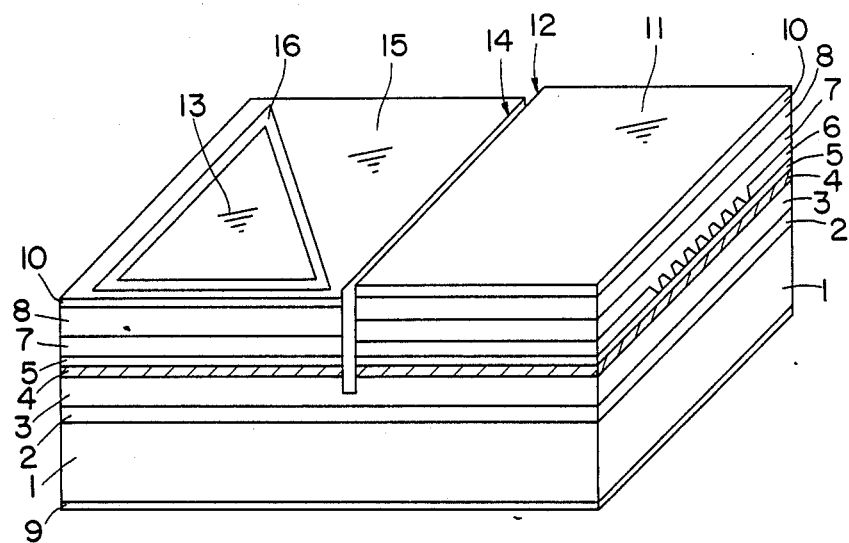
FIG. 1 is a perspective view showing a scanning apparatus of this invention.

FIG. 1 shows a scanning apparatus of this invention in which a laser beam oscillating area, (e.g., a semiconductor laser array device) 11 and a refracting area 13 are disposed on the same substrate 1. This scanning apparatus is produced as follows: On an n-GaAs substrate 1, a buffer layer 2 having a thickness of 0.5 μm, an n-Ga$_{0.5}$Al$_{0.5}$As cladding layer 3 having a thickness of 1.4 μm, a multilayered quantum well active layer 4 that is composed of alternate layers consisting of a fixed number of GaAs well layers having a thickness of 130 Å each and a fixed number of Ga$_{0.6}$Al$_{0.4}$As barrier layers having a thickness of 50 Å each, a p-Ga$_{0.5}$Al$_{0.5}$As cladding layer 5 having a thickness of 0.3 μm, and an n-GaAs current blocking layer 6 having a thickness of 0.5 μm are successively formed by a crystal growth technique such as metal-organic chemical vapor deposition, molecular beam epitaxy or the like.

Figure 2:
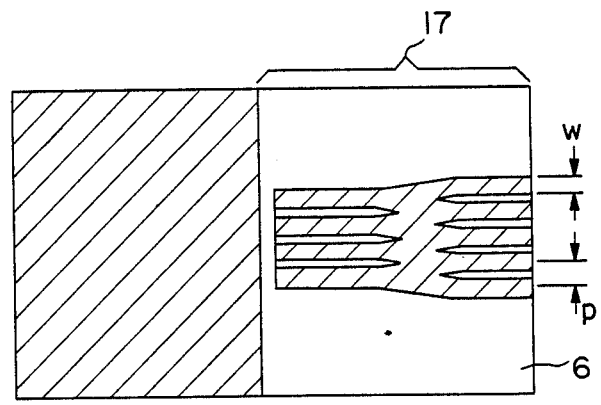
FIG. 2 is a plane view showing a current blocking layer of the scanning apparatus of this invention shown in FIG. 1.

Then, the n-GaAs current blocking layer 6 is selectively removed by photolithography using an etchant such as a mixture of one part by weight of NH$_3$, 15 parts by weight of H$_2$O$_2$ and 144 parts by weight of H$_2$O, whereby a portion of the n-GaAs current blocking layer 6 that belongs to the semiconductor laser array device 11 is patterned such as that shown in FIG. 2 and the other portions of the n-GaAs current blocking layer 6 that belong to the optical guiding area 15 including the refracting area 13 are removed.

Then, on the patterned n-GaAs current blocking layer 6 and the portion of the p-GaAlAs cladding layer 5 that is exposed from the patterned current blocking layer 6, a p-Ga$_{0.5}$Al$_{0.5}$As cladding layer 7 having a thickness of 1.2 μm and a p-GaAs cap layer 8 having a thickness of 1.0 μm are epitaxially grown in that order. Then, a boundary region 16 that is of a triangle-shape in the plane view is formed from the cap layer 8 to the n-cladding layer 3 so that the electrical resistance thereof becomes high by the supply of protons thereto, resulting in the change in the refractive index of the waveguide of the refracting area 13. To create a difference in the refractive index of the refracting area, the said boundary region 16 can be also formed by an n-conductive layer based on the selective diffusion of sulfur (s) in the case where the layers 5, 7 and 8 are of p-conductive layers, or by a p-conductive layer based on the selective diffusion of zinc (Zn) in the case where the layers 5, 7 and 8 are of n-conductive layers.

After the formation of the boundary region 16, the n-GaAs substrate 1 is polished to a thickness of about 100 μm and washed. Thereafter, n- and p-ohmic electrodes 9 and 10 are formed on the back face of the n-substrate 1 and the upper face of the cap layer 8, respectively.

Then, a facet 12, from which laser beams are emitted, of the semiconductor laser array device 11 and a facet 14, upon which laser beams are incident, of the optical guiding area 15 including the refracting area 13 therein are formed by a reactive ion beam etching technique using chlorine gas and a multi-layered resist film as a masking substance. In order to optically and efficiently combine laser beams from the semiconductor laser array device 11 with the refracting are 13, the space between the facets 12 and 14 is set to be 1-2 μm.

Finally, the wafer obtained is cleaved so that the cavity length of the semiconductor laser array device 11 becomes about 250 μm and the length of the refracting area 13 becomes 250 μm, resulting in a scanning apparatus.

The scanning apparatus obtained works as follows: The n-GaAs current blocking layer 6 of the semiconductor laser array device 11 constitutes a current path through which current passes. The current is then injected into the active layer 4 via the current path. Laser light from the active layer 4 is absorbed by the n-GaAs current blocking layer 6, resulting in waveguides with a Y-shaped branching structure (FIG. 2) in the active layer, so that the phase-shift between the adjacent waveguides of the semiconductor laser array device 11 becomes 0°, and accordingly the said semiconductor laser array device 11 can oscillate laser beams with a single peak in a 0° phase-mode. In this example, the width (W) of each of the waveguides and the pitch (P) thereof are set to be 3 μm and 5 μm, respectively. The number of waveguides are twelve on the right-side area and eleven on the left-side area on the sheet of FIG. 2. (For the convenience of indication in the drawing, waveguides of a number smaller than the number described herein are illustrated.)

Figure 3:
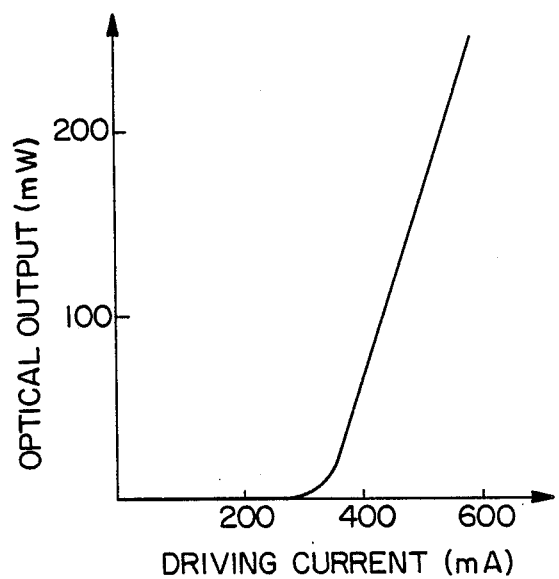
FIG. 3 is a characteristic curve showing the relationship between the optical output and the driving current at laser oscillation.

FIG. 3 is a characteristic curve showing the relationship between the optical output and the driving current at laser oscillation, wherein the axis of abscissa indicates the driving current that is applied to the semiconductor laser array device 11 and the axis of ordinate indicates the optical output of laser beams that are oscillated from the semiconductor laser array device 11. As seen from FIG. 3, the threshold current value at laser oscillation is 350 mA.

Figure 4:
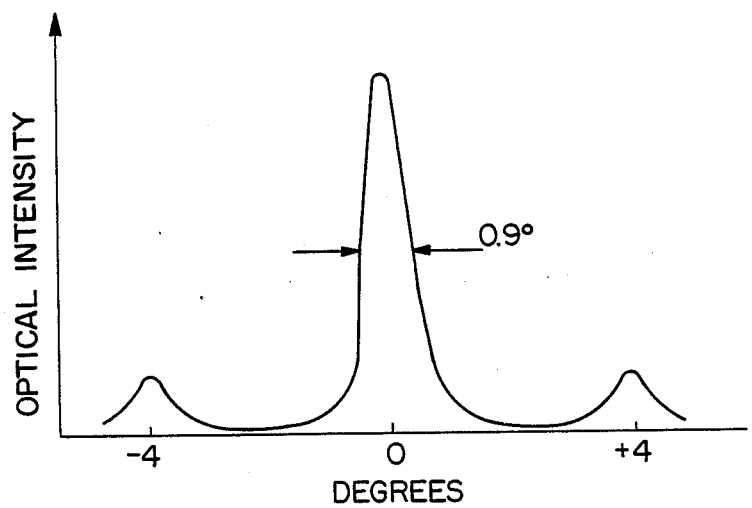
FIG. 4 is a graph showing the far-field pattern of laser output attained by the scanning apparatus of this invention shown in FIG. 1.

FIG. 4 shows the far-field pattern of optical output attained by the scanning apparatus of Example 1, wherein the axis of abscissa indicates angles that represent the width of the far-field pattern in the direction parallel to the active layer of the semiconductor laser array device and the axis of ordinate indicates the optical intensity of laser beams at the time when laser output is 100 mW hour. FIG. 4 indicates that the far-field pattern attained by the said scanning apparatus exhibits the full-width of half maximum of 0.9°; that is, the scanning apparatus attains narrow beam oscillation.

Figure 5:
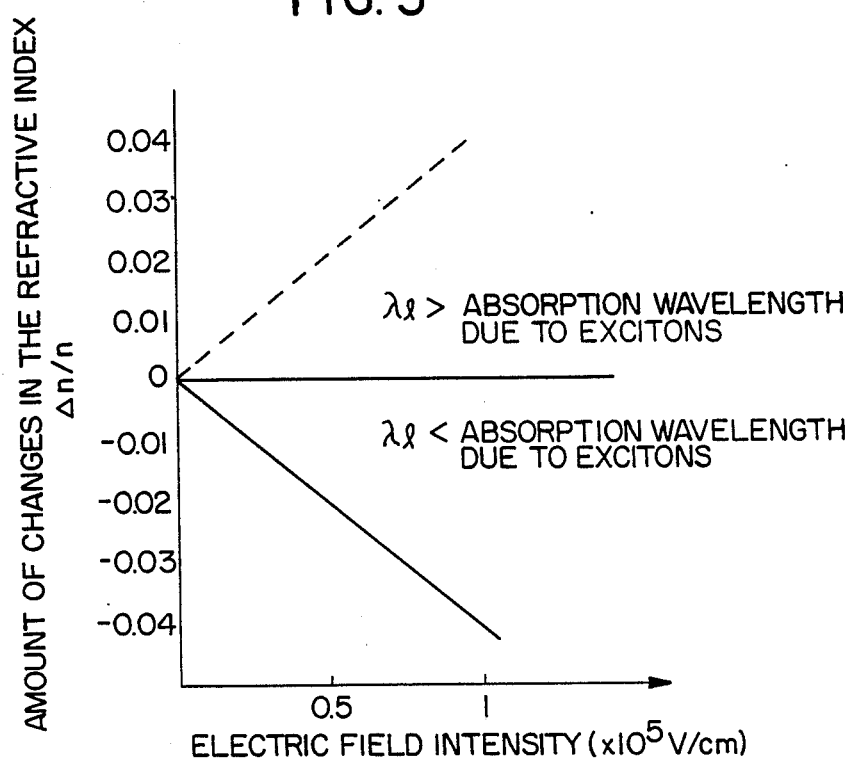
FIG. 5 shows the relationship between the intensity of electric field and the amount of changes in the refractive index in the refracting area of the scanning apparatus of this invention shown in FIG. 1.

FIG. 5 shows the relationship between the intensity of electric field and the amount of changes in the refractive index of the waveguide in the refracting area of the said scanning apparatus of Example 1, wherein the axis of abscissa indicates the electric field intensity that is applied to the active layer with a multi-layered quantum well structure in the refracting area and the axis of ordinate indicates the amount of changes in the refractive index of the waveguide of the active layer in the refracting area. The solid line indicates the above-mentioned relationship in the case where the oscillation wavelength λe of laser beams is shorter than the absorption wavelength due to excitons and the dotted line indicates the above-mentioned relationship in the case where the oscillation wavelength λe of laser beams is longer than the absorption wavelength due to excitons. FIG. 5 indicates that when a reversed bias-voltage is applied to the active layer to create a high electric field therein, the refractive index of the waveguide of the active layer remarkably increases or decreases depending upon the relationship between the oscillation wavelength of laser beams and the absorption wavelength due to excitons. In general, with the oscillation wavelength attained by a semiconductor laser device with the active layer of a multi-layered quantum well structure, the refractive index of the waveguide of the active layer increases with an increase in the electrical field intensity applied to the active layer as shown by dotted line of FIG. 5; for example, when an electric field intensity of $1 \times 10^5$ V/cm$^2$ is applied to the active layer, the amount of changes in the refractive index of the waveguide of the active layer become about 4%.

Figure 6:
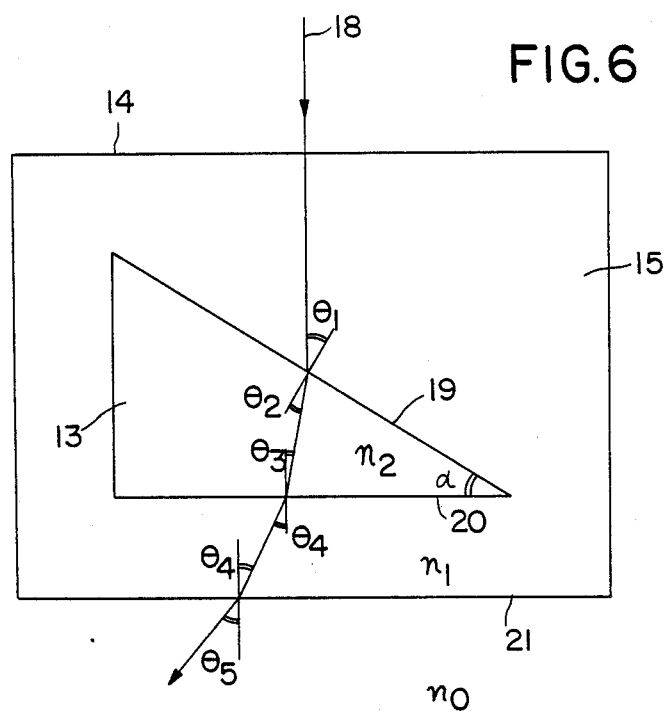
FIG. 6 is a diagram showing the refraction of laser beams that are incident upon the refracting area of the scanning apparatus of this invention shown in FIG. 1.

FIG. 6 shows the refraction at the time when laser beams are incident upon the refracting area, wherein the angle between the surface 19 of the waveguide of the refracting area 13 upon which laser beams are incident and the surface 20 (parallel to the facet 14) of the waveguide of the refracting area 13 upon which laser beams reflect is set to be α; the refractive index of the optical guiding region 15 is $n_1$; the refractive index of the refracting area 13 is $n_2$; and the refractive index of air is $n_0$. When the angle of incidence and the angle of refraction of laser beams 18 upon the surface 19 are $\theta_1$ and $\theta_2$, respectively; the angle of incidence and the angle of refraction of laser beams 18 upon the surface 20 are $\theta_3$ and $\theta_4$, respectively; and the angle of incidence and the angle of refraction upon the facet 21 are $\theta_4$ and $\theta_5$, respectively; the following equations (1) to (3) can be set up by Snell's law of refraction:

$$n_1 \sin \theta_1 = n_2 \sin \theta_2 \tag{1}$$

$$n_2 \sin \theta_3 = n_1 \sin \theta_4 \tag{2}$$

$$n_1 \sin \theta_4 = n_0 \sin \theta_5 \tag{3}$$

Since $\theta_1 = \alpha$, and $\theta_3 = \alpha - \theta_2$, the following equation (4) can be set up:

$$\sin\alpha \sqrt{n_2^2 - n_1^2 \sin^2\alpha} = n_1\cos\alpha, \sin\alpha = n_0 \sin\theta_5 \quad (4)$$

Given that $n_2 = n_1 + \Delta n_1$, and $n_0 = 1$, the following equation (5) can be set up:

$$\sin\theta_5 = n_1 \sin\alpha (\sqrt{(1 + \Delta n_1/n_1)^2 - \sin^2\alpha} - \cos\alpha) \quad (5)$$

Figure 7:
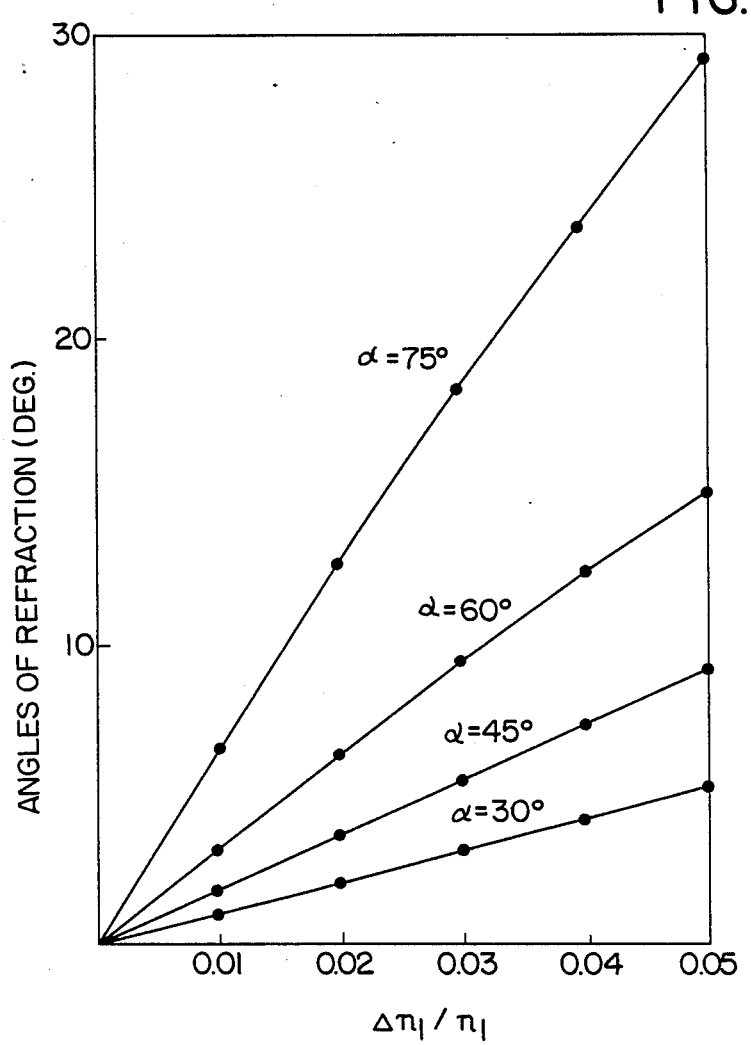
FIGS. 7 and 8, respectively, are graphs showing the relationship between the angle $\theta_5$ of reflection and the changes $\Delta n_1/n_1$ in the refractive index of the refracting area, wherein the angle $\alpha$ between one surface of the waveguide of the refracting area upon which laser beams are incident and another surface of the waveguide of the refracting area upon which laser beams reflect is set to be a parameter.

The relationship between the value of $\theta_5$ and the value of $\Delta n_1/n_1$ when the value of $\alpha$ is set to be a parameter in the case where the refractive index of the active layer increases by the application of an electric field to the refracting area (this phenomenon is indicated by dotted line of FIG. 5 can be given by the equation (5), which is shown in FIG. 7, wherein the axis of abscissa indicates the value of $\Delta n_1/n_1$ and the axis of ordinate indicates the angle $\theta_5$ of refraction upon the facet 21. It can be seen from FIG. 7 that when the value of $\alpha$ is, for example, 60° and the value of $\Delta n_1/n_1$ (i.e., the changes in the refractive index of the waveguide of the active layer) is +4%, the angle of refraction of about 12° is obtainable.

Figure 8:
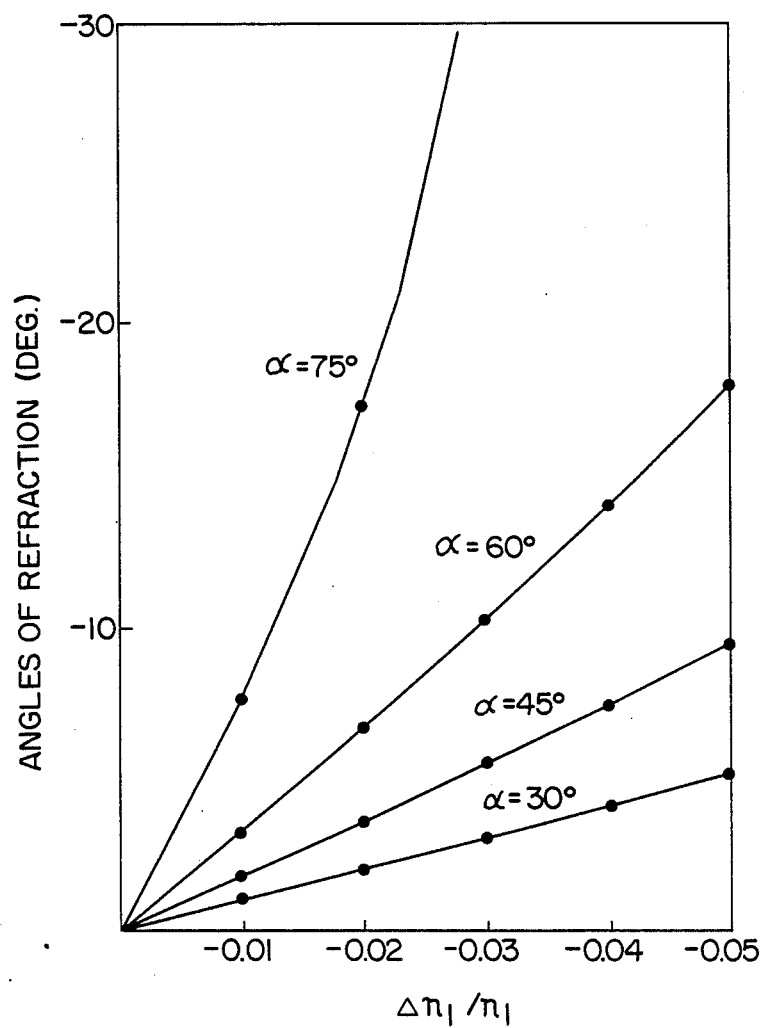

FIG. 8 shows the relationship between the value of $\theta_5$ and the value of $\Delta n_1/n_1$ when the refractive index of the active layer decreases by the application of an electric field to the refracting area (this phenomenon is indicated by the solid line of FIG. 5). In practice, this phenomenon can be realized by the use of a thin active layer by which oscillation wavelength can be shortened.

EXAMPLE 2

Figure 9:
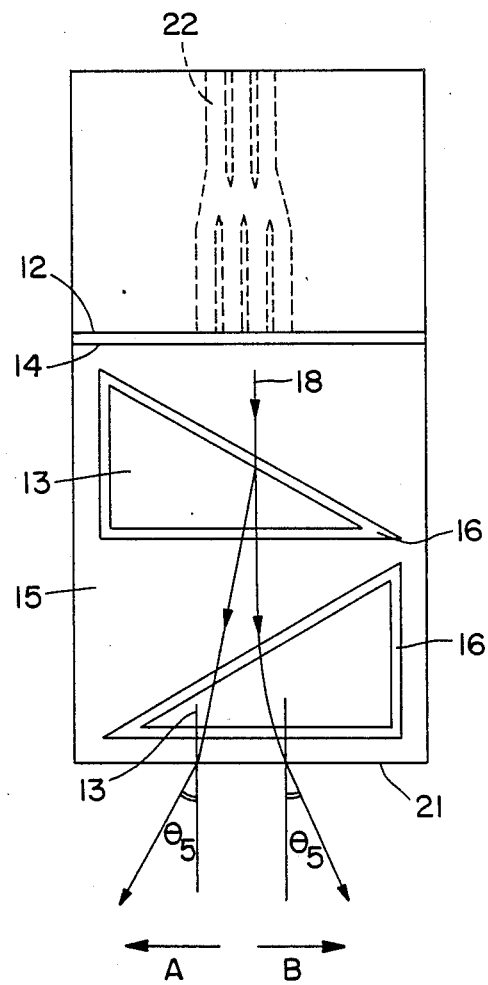
FIG. 9 is a plane view showing another scanning apparatus of this invention.

FIG. 9 shows another scanning apparatus of this invention, which has the same structure as that of FIG. 1 except that this apparatus of Example 2 comprises a pair of refracting areas 13, each of which is surrounded by a boundary region 16.

The two refracting areas 13 of the said scanning apparatus are electrically connected in series, and by the application of an electric field to either of the two, the laser beams from the scanning apparatus can refract upon the facet 21 at a refraction angle of $\theta_5$ that is variable in the wide range.

With the scanning apparatus of this example shown in FIG. 9, it was observed that when the value of $\alpha$ was set to be 60°, narrow beams were oscillated with the full-width of half maximum of 0.9° and the refraction angle $\theta_5$ on the facet 21 was 12° in both the directions of arrows A and B on the surface of FIG. 9.

Although the above-mentioned examples only disclose a semiconductor laser array device composed of the GaAlAs-GaAs systems, this invention can be also applied to semiconductor laser array devices composed of other materials such as the InP-InGaAsP systems. Moreover, although the above-mentioned examples only disclose the use of a Y-shaped branching waveguide structure as a laser beam-oscillating means, other oscillating means can be, of course, employed to attain the same refraction effect. Three or more refracting areas can be also disposed in the directions as desired in the scanning apparatus.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a scanning apparatus with a refracting function, said scanning apparatus including a laser beam oscillating area and an optical waveguiding area that is optically coupled with said laser beam oscillating area, the combination of:

one or more refracting areas that are formed within said optical waveguiding area, said optical waveguiding area being surrounded with one or more boundary regions so that laser beams from said laser beam oscillating area are incident upon the waveguide of each of said refracting areas with an inclination to said waveguide; and a means for applying an electrical field to the waveguide of said refracting area, by which the changes in the refractive index of the waveguide of said refracting area attained so that laser beams from said laser beam oscillating area undergo refraction while they pass through the waveguide of said refracting area.

2. A scanning apparatus according to claim 1, wherein said one or more boundary regions are disposed by the injection of protons into said optical waveguiding area.

3. A scanning apparatus according to claim 1, wherein said one or more boundary regions are disposed by the diffusion of a dopant into the optical waveguiding area.

* * * * *